US012293748B2

United States Patent
Yang et al.

(10) Patent No.: US 12,293,748 B2
(45) Date of Patent: May 6, 2025

(54) NOISE REDUCTION ASSEMBLY AND NEW ENERGY EQUIPMENT

(71) Applicant: Sungrow Power Supply Co., Ltd., Hefei (CN)

(72) Inventors: Xin Yang, Hefei (CN); Jie Zhou, Hefei (CN); Qi Yao, Hefei (CN)

(73) Assignee: Sungrow Power Supply Co., Ltd., Hefei (CN)

( * ) Notice: Subject to any disclaimer, the term of this patent is extended or adjusted under 35 U.S.C. 154(b) by 290 days.

(21) Appl. No.: 17/878,136

(22) Filed: Aug. 1, 2022

(65) Prior Publication Data

US 2023/0178060 A1 Jun. 8, 2023

(30) Foreign Application Priority Data

Dec. 3, 2021 (CN) .......................... 202111479191.0

(51) Int. Cl.
*G10K 11/162* (2006.01)
*H05K 7/20* (2006.01)

(52) U.S. Cl.
CPC ....... *G10K 11/162* (2013.01); *H05K 7/20172* (2013.01)

(58) Field of Classification Search
CPC ................... G10K 11/162; H05K 7/20172
USPC ............................................. 181/199–202
See application file for complete search history.

(56) References Cited

U.S. PATENT DOCUMENTS

| | | | | |
|---|---|---|---|---|
| 2,892,507 A * | 6/1959 | Kirkpatrick | ............. | H01F 27/33 336/59 |
| 7,646,603 B2 * | 1/2010 | Bard | .................. | H05K 7/20745 361/701 |
| 8,144,465 B2 * | 3/2012 | Liang | ........................ | G06F 1/20 361/679.48 |

(Continued)

FOREIGN PATENT DOCUMENTS

CN 106762344 A 5/2017
CN 211807677 U 10/2020

(Continued)

OTHER PUBLICATIONS

First Office Action for Chinese Application No. 202111479191.0, dated Mar. 31, 2023.

(Continued)

*Primary Examiner* — Forrest M Phillips
*Assistant Examiner* — Joseph James Peter Illicete
(74) *Attorney, Agent, or Firm* — Wolf, Greenfield & Sacks, P.C.

(57) ABSTRACT

A noise reduction assembly includes an outer frame and a partition plate. An accommodating cavity is arranged in the outer frame; the partition plate is arranged in the accommodating cavity, and the partition plate and the outer frame form a noise reduction channel, the noise reduction channel includes a first noise reduction section, a second noise reduction section and a third noise reduction section that are communicated in sequence, and the channel cross-sectional areas of the first noise reduction section and the third noise reduction section are both smaller than the channel cross-sectional area of the second noise reduction section. The technical solution of the present application may reduce the noise of a new energy equipment having the noise reduction assembly during operation.

12 Claims, 11 Drawing Sheets

(56) References Cited

U.S. PATENT DOCUMENTS

| | | | | |
|---|---|---|---|---|
| 9,402,333 | B2* | 7/2016 | Li | H05K 7/20145 |
| 9,504,182 | B2* | 11/2016 | Olsson | H01G 2/08 |
| 10,309,302 | B2* | 6/2019 | Wilhelm | F02B 77/13 |
| 11,665,838 | B2* | 5/2023 | Zhang | H05K 7/1485 |
| | | | | 312/100 |
| 2006/0104027 | A1 | 5/2006 | Vinson et al. | |
| 2007/0218826 | A1 | 9/2007 | Walsh et al. | |
| 2011/0284316 | A1 | 11/2011 | O'Coimin et al. | |
| 2016/0088763 | A1 | 3/2016 | Olsson et al. | |
| 2018/0199463 | A1 | 7/2018 | Oota et al. | |
| 2021/0301834 | A1 | 9/2021 | Hung | |

FOREIGN PATENT DOCUMENTS

| | | |
|---|---|---|
| CN | 112555197 A | 3/2021 |
| CN | 212841780 U | 3/2021 |
| CN | 213029066 U | 4/2021 |
| CN | 214226723 U | 9/2021 |
| EP | 2 554 034 A2 | 2/2013 |
| EP | 3 008 781 A1 | 4/2016 |
| KR | 10-0717680 B1 | 5/2007 |
| KR | 10-1435007 B1 | 8/2014 |
| TW | M598581 U | 7/2020 |

OTHER PUBLICATIONS

Extended European Search Report for European Application No. 22185733.7, dated Apr. 26, 2023.

\* cited by examiner

NOISE REDUCTION ASSEMBLY AND NEW ENERGY EQUIPMENT

CROSS REFERENCE TO RELATED APPLICATIONS

This application claims the priorities to Chinese patent application No. 202111479191.0, titled "NOISE REDUCTION ASSEMBLY AND NEW ENERGY EQUIPMENT", filed with the China National Intellectual Property Administration Dec. 3, 2021, the entire disclosure of which is hereby incorporated by reference.

FIELD

The present application relates to the technical field of new energy equipment, in particular to a noise reduction assembly and new energy equipment having the noise reduction assembly.

BACKGROUND

At present, in order to achieve good heat dissipation of the electrical devices in the new energy equipment, a heat dissipation device is usually mounted inside the new energy equipment to dissipate heat of the electrical devices in the electronic products. However, the heat dissipation device is prone to generate noise during operation, and for the noise generated by the heat dissipation device during operation, no device is designed for reducing the noise of the electronic products in the related art. In this way, the noise generated by the heat dissipation device during operation may be transmitted to the outside, causing a relatively large noise during operation of the new energy equipment.

SUMMARY

A main object of the present application is to provide a noise reduction assembly, which aims to reduce the noise of new energy equipment during operation.

In order to achieve the above object, the noise reduction assembly proposed by the present application includes:
an outer frame, and
a partition plate,
specifically, an accommodating cavity is arranged in the outer frame; and the partition plate is arranged in the accommodating cavity, and the partition plate and the outer frame form a noise reduction channel, the noise reduction channel includes a first noise reduction section, a second noise reduction section and a third noise reduction section that are communicated in sequence, and the channel cross-sectional areas of the first noise reduction section and the third noise reduction section are both smaller than the channel cross-sectional area of the second noise reduction section.

In an embodiment, multiple partition plates are provided, the multiple partition plates are all arranged in the accommodating cavity, and are sequentially arranged in a direction that one side of two opposite sides of the outer frame faces the other side;
a part of the structure of each partition plate and the outer frame form a first noise reduction section and a second noise reduction section, and the other part of the structure, the part of the structure of the adjacent partition plate and the outer frame form a third noise reduction section;
the outer frame is further provided with a channel inlet communicated with the first noise reduction section, and a channel outlet communicated with the third noise reduction section.

In an embodiment, in an arrangement direction parallel to the multiple partition plates, each of the partition plates includes a first plate body, a second plate body and a third plate body connected in sequence;
it is defined that the accommodating cavity has a first inner wall and a second inner wall, which are opposite to each other, in a direction perpendicular to the arrangement direction of the partition plates, the first plate body is attached to the first inner wall, the second plate body extends toward the second inner wall, and the third plate body extends along a direction of the second plate away from the first plate, and a gap is present between the third plate body and the second inner wall.

In an embodiment, the first plate body, the second plate body and the third plate body are all of a flat plate shape;
or, the first plate body and the third plate body are both of a flat plate shape, and the second plate body is of an arc plate shape.

In an embodiment, the included angle formed by the second plate body and the third plate body and the included angle formed by the first plate body and the third plate body are both set at an obtuse angle;
and/or, the first plate body, the second plate body and the third plate body are of an integral structure;
and/or, the partition plate further includes a fourth plate body, the fourth plate body is connected to one side, adjacent to the second plate body, of the third plate body, and an included angle is formed by the fourth plate body and the third plate body, the fourth plate abuts against and is connected to the cavity wall, connecting the first inner wall and the second inner wall, of the accommodating cavity;
and/or, the outer frame includes a bottom frame and a panel, the panel is covered with the bottom frame, and the panel and the bottom frame form the accommodating cavity.

In an embodiment, multiple channel inlets are all defined on the second inner wall, and multiple channel outlets are all defined on the first inner wall.

In an embodiment, each of the channel inlets is arranged opposite to one of the third plate bodies;
and/or, the uppermost partition plate among the multiple partition plates and the outer frame at a side away from the channel outlet form a first auxiliary air duct, and a gap is present between the uppermost partition and an upper cavity wall of the accommodating cavity, the outer frame is further provided with a first auxiliary air inlet that communicates with the first auxiliary air duct;
and/or, the partition plate located at the bottom among the multiple partition plates and the outer frame on a side facing the channel inlet form a second auxiliary air duct, the second auxiliary air duct is connected to the second noise reduction section of the lowermost noise reduction channel, and the outer frame is further provided with a second auxiliary air inlet and an auxiliary air outlet that communicate with the second auxiliary air duct, and the auxiliary air outlet is arranged adjacent to the lowermost channel inlet.

In an embodiment, it is defined that a channel cross-sectional area of the first noise reduction section is S1, a channel cross-sectional area of the second noise reduction section is S2, and a channel cross-sectional area of the third noise reduction section is S3, satisfying the relationship: $S1/S2 \leq \frac{1}{2}$, and/or $S3/S2 \leq \frac{1}{2}$.

In an embodiment, the channel cross-sectional area S1 of the first noise reduction section is the same as the channel cross-sectional area S3 of the third noise reduction section.

In an embodiment, an inner wall surface of the noise reduction channel is provided with a silencing layer.

In an embodiment, the silencing layer is bonded and fixed to the inner wall surface of the noise reduction channel; and/or, the silencing layer is silencing cotton.

A new energy equipment is further provided according to the present application, including:
 a heat dissipation device; and
 a noise reduction assembly,
 the noise reduction assembly includes an outer frame and a partition plate, and an accommodating cavity is arranged in the outer frame; the partition plate is arranged in the accommodating cavity, and the partition plate and the outer frame form a noise reduction channel, the noise reduction channel includes a first noise reduction section, a second noise reduction section and a third noise reduction section that are communicated in sequence, and the channel cross-sectional areas of the first noise reduction section and the third noise reduction section are both smaller than the channel cross-sectional area of the second noise reduction section. The first noise reduction section of the noise reduction assembly is communicated with the heat dissipation device.

In an embodiment, the heat dissipation device is a heat dissipation fan.

When the noise reduction assembly of the technical solution of the present application is applied to the new energy equipment, it can be communicated with the heat dissipation device of the new energy equipment through the noise reduction channel. Moreover, the noise reduction channel of the noise reduction assembly in this solution includes a first noise reduction section, a second noise reduction section and a third noise reduction section that are communicated in sequence. The channel cross-sectional areas of the first noise reduction section and the third noise reduction section are both smaller than the channel cross-sectional area of the second noise reduction section. In the process that the noise generated when the heat dissipation device works is transmitted to the outside through the noise reduction channel, due to the sudden change of the cross-sectional area of the noise reduction channel at the connection between various sections, the impedance of the noise sound waves may be mismatched and reflected, and the intensity of noise may be attenuated. Therefore, the sound energy of the noise generated by the heat dissipation device when it works to the outside is greatly reduced, thus reducing the noise of the new energy equipment when it works. In addition, according to the noise reduction channel of the noise reduction assembly in this solution, the channel cross-sectional area of the noise reduction channel is changed by setting a second noise reduction section with a relatively large channel cross-sectional area. As a result, the overall channel cross-sectional area of the noise reduction channel is still relatively large, which can ensure a large air intake volume, thereby ensuring the heat dissipation effect on the electrical components in the new energy equipment. That is, the noise reduction assembly in this solution not only has a noise reduction effect on the new energy equipment, but also can ensure the heat dissipation effect on the new energy equipment. In addition, the noise reduction assembly in this solution includes an outer frame and a partition plate, so that the outer frame and the partition plate can be manufactured independently, and then assembled into a whole to form a noise reduction channel. The structures of the outer frame and the partition plate are relatively simple, which is conducive to improving the convenience of processing and forming the noise reduction channel.

BRIEF DESCRIPTION OF THE DRAWINGS

For more clearly illustrating the technical solutions of embodiments of the present application or in the conventional technology, drawings referred to for describing the embodiments or the conventional technology will be briefly described hereinafter. Apparently the drawings in the following description are only several examples of the present application, and for those skilled in the art, other drawings may be obtained based on the structures shown in these drawings without any creative efforts.

Figure 1:
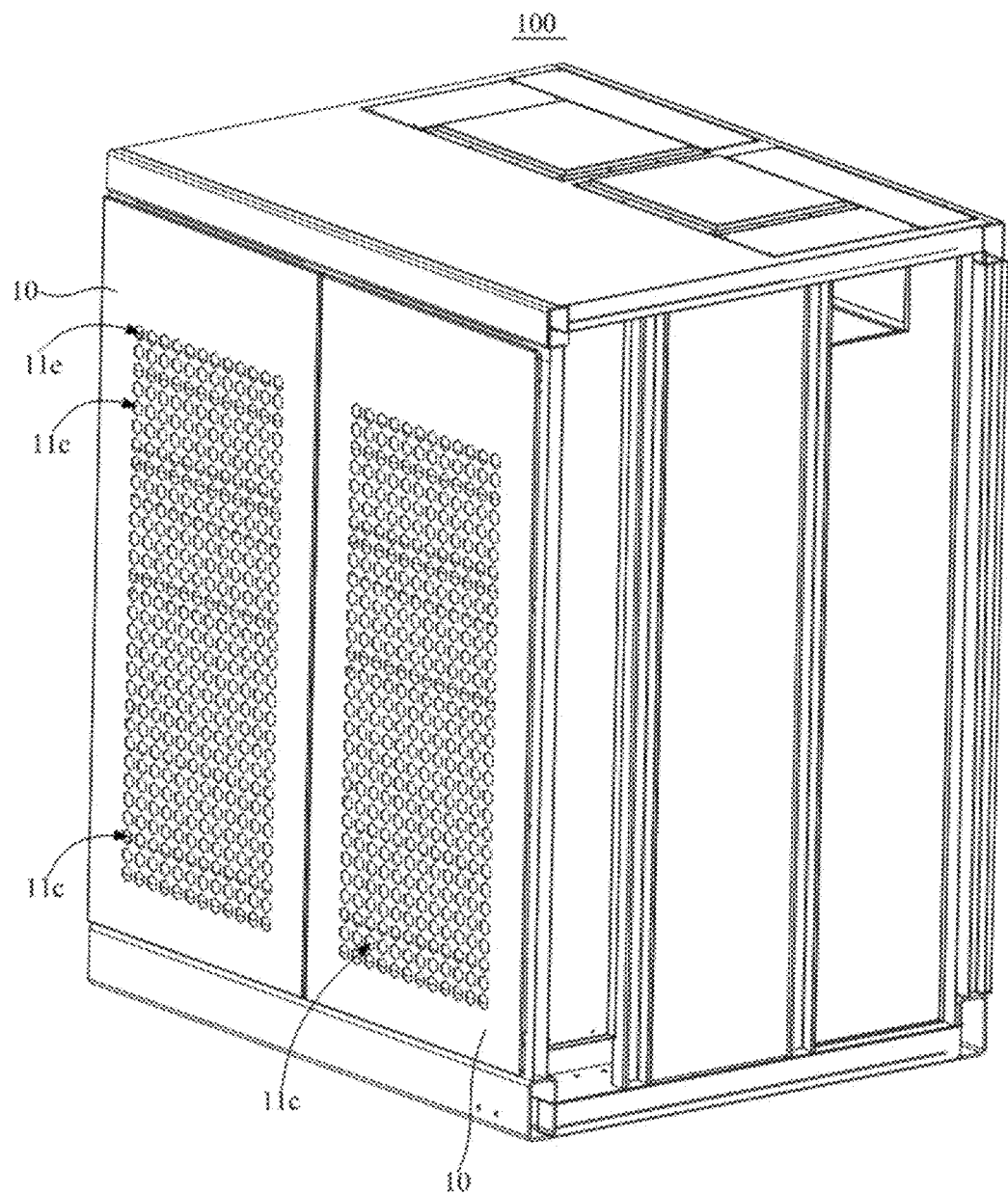
FIG. 1 is a schematic structural diagram of an embodiment of a new energy equipment according to the present application.

Reference numerals in the drawings:

| reference numerals | names | reference numerals | names |
|---|---|---|---|
| 100 | New energy equipment | 11e | First auxiliary air inlet |
| 10 | Noise reduction assembly | 11f | Second auxiliary air inlet |
| 10a | Noise reduction channel | 11g | Auxiliary air outlet |
| 10b | First noise reduction section | 13 | Partition plate |
| 10c | Second noise reduction section | 131 | First plate body |
| 10d | Third noise reduction section | 133 | Second plate body |
| 11 | Outer frame | 135 | Third plate body |
| 11a | Accommodating cavity | 137 | Fourth plate body |
| 11b | Channel inlet | 10e | First auxiliary air duct |
| 11c | Channel outlet | 10f | Second auxiliary air duct |
| 111 | Bottom frame | 15 | Silencing layer |
| 113 | Panel | 151 | Silencing cotton |

| reference numerals | names | reference numerals | names |
| --- | --- | --- | --- |
| 115 | First inner wall | 30 | Heat dissipation fan |
| 117 | Second inner wall | | |

The implementations, function features and advantages of the present disclosure will be further described in conjunction with embodiments by referring to the drawings.

DETAILED DESCRIPTION OF THE EMBODIMENTS

Technical solutions of embodiments of the present disclosure will be clearly and completely described hereinafter in conjunction with the drawings of the embodiments of the present disclosure. Apparently, the embodiments described are only part embodiments of the present disclosure, rather than all embodiments. Other embodiments obtained by the person skilled in the art without any creative efforts based on the embodiments of the present disclosure fall into the scope of the present disclosure.

It should be noted that all directional terms (such as top, bottom, left, right, front, back, etc.) in embodiments of the present disclosure are only intended to illustrate a relative position relationship, relative motion, or the like between different components under a particular attitude (as shown in the drawings). The directional terms may change in case of a different attitude.

In the present disclosure, unless clearly defined or described otherwise, the terms "connection" and "fixation" should be broadly interpreted. For example, unless clearly defined otherwise, "fixation" may be a fixed connection, a detachable connection, or connection as an integral, may be a mechanical connection or an electrical connection, may be a direct connection, an indirect connection via a medium, or an internal connection or interaction between two elements. For those skilled in the art, the specific meaning of the above terms in the present application may be understood in the light of specific circumstances.

In addition, the descriptions of "first" and "second" in the present application are only used for descriptive purposes, and cannot be understood as indicating or implying their relative importance or implicitly indicating the number of indicated technical features. Thus, the features defined by "first", "second" can explicitly or implicitly include one or more the features. In addition, the technical solutions between the various embodiments can be combined with each other, but they must be based on the realization by a person skilled in the art. When the combination of technical solutions is contradictory or cannot be realized, it should be considered that such a combination of technical solutions does not exist, and is not within the protection scope of the present disclosure.

Figure 2:
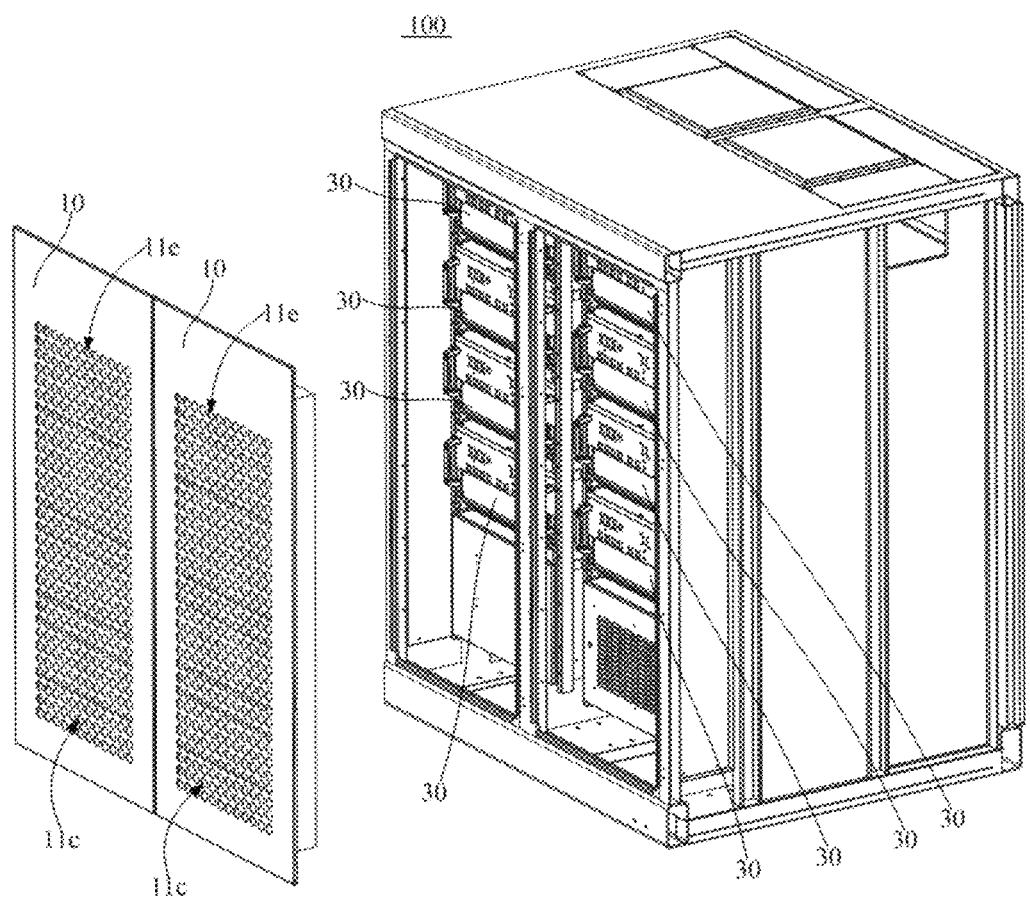
FIG. 2 is a perspective view of the explosion structure of the new energy equipment in FIG. 1.
Figure 3:
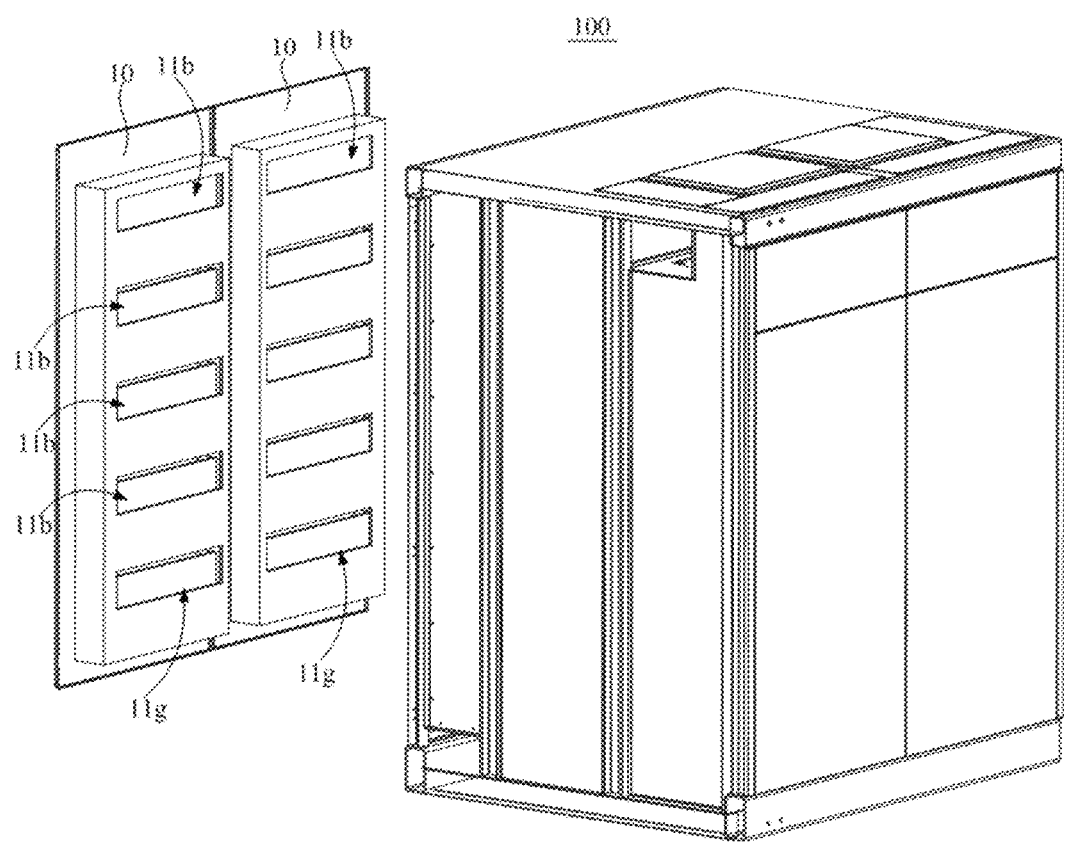
FIG. 3 is another perspective view of the explosion structure of the new energy equipment in FIG. 1.

Referring to FIG. 1, FIG. 2 and FIG. 3, a noise reduction assembly 10 is provided according to the present application, which can be applied to new energy equipment 100. The new energy equipment 100 may be an energy storage cabinet, and of course may also be an inverter or a charging pile or the like. That is, the specific type of the new energy equipment 100 is not limited in the present application.

Figure 4:
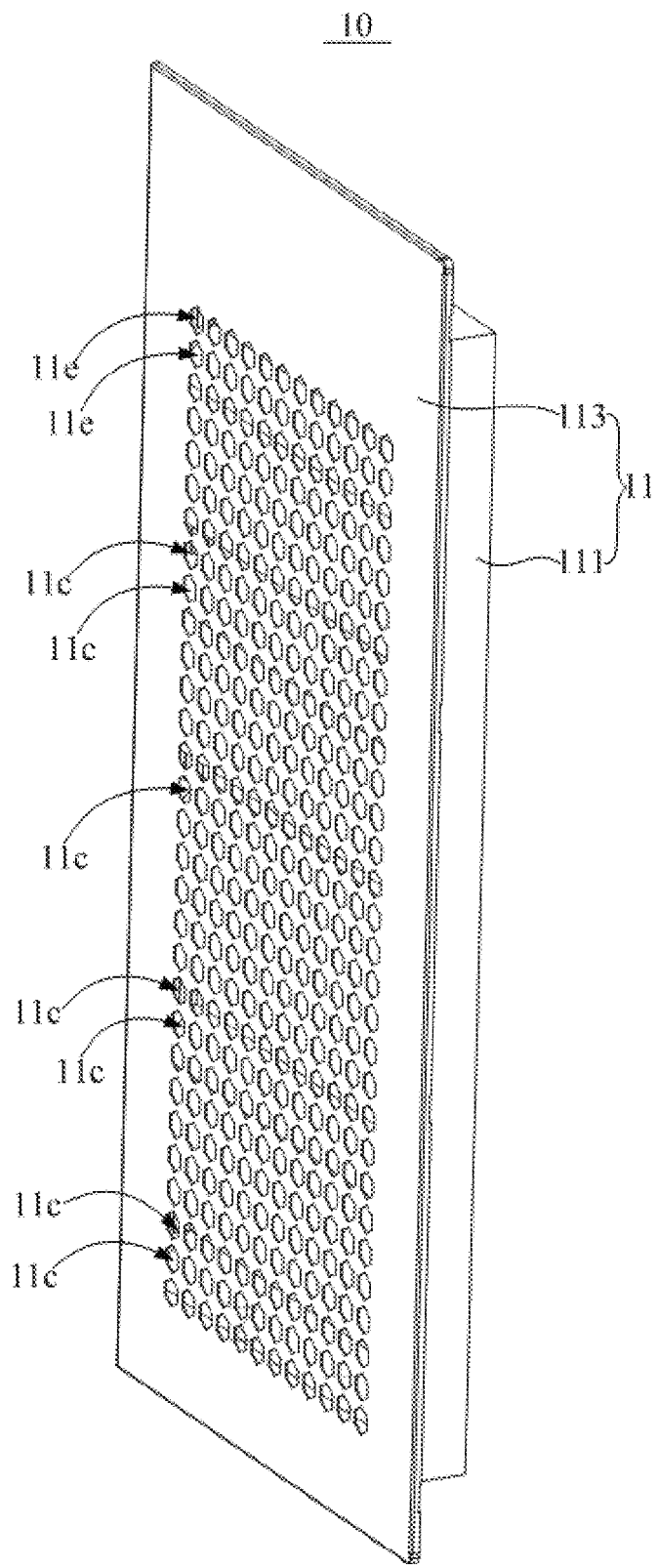
FIG. 4 is a schematic structural diagram of an embodiment of the noise reduction assembly of the new energy equipment in FIG. 1.
Figure 5:
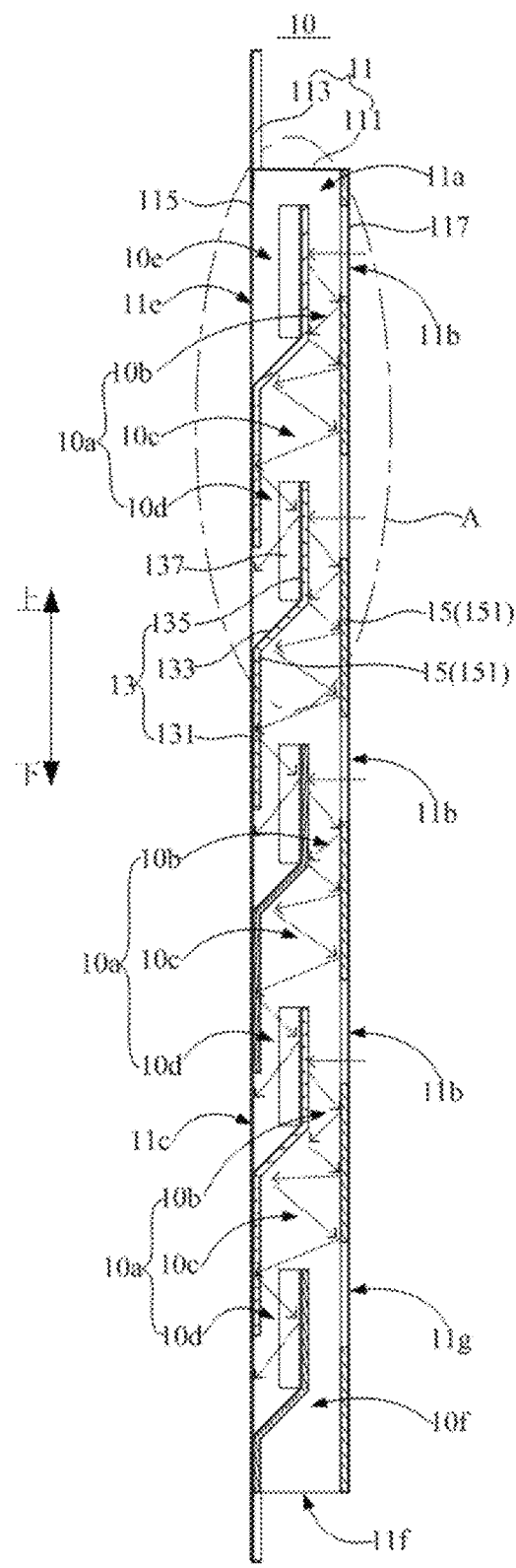
FIG. 5 is a schematic cross-sectional view of the noise reduction assembly in FIG. 4.
Figure 6:
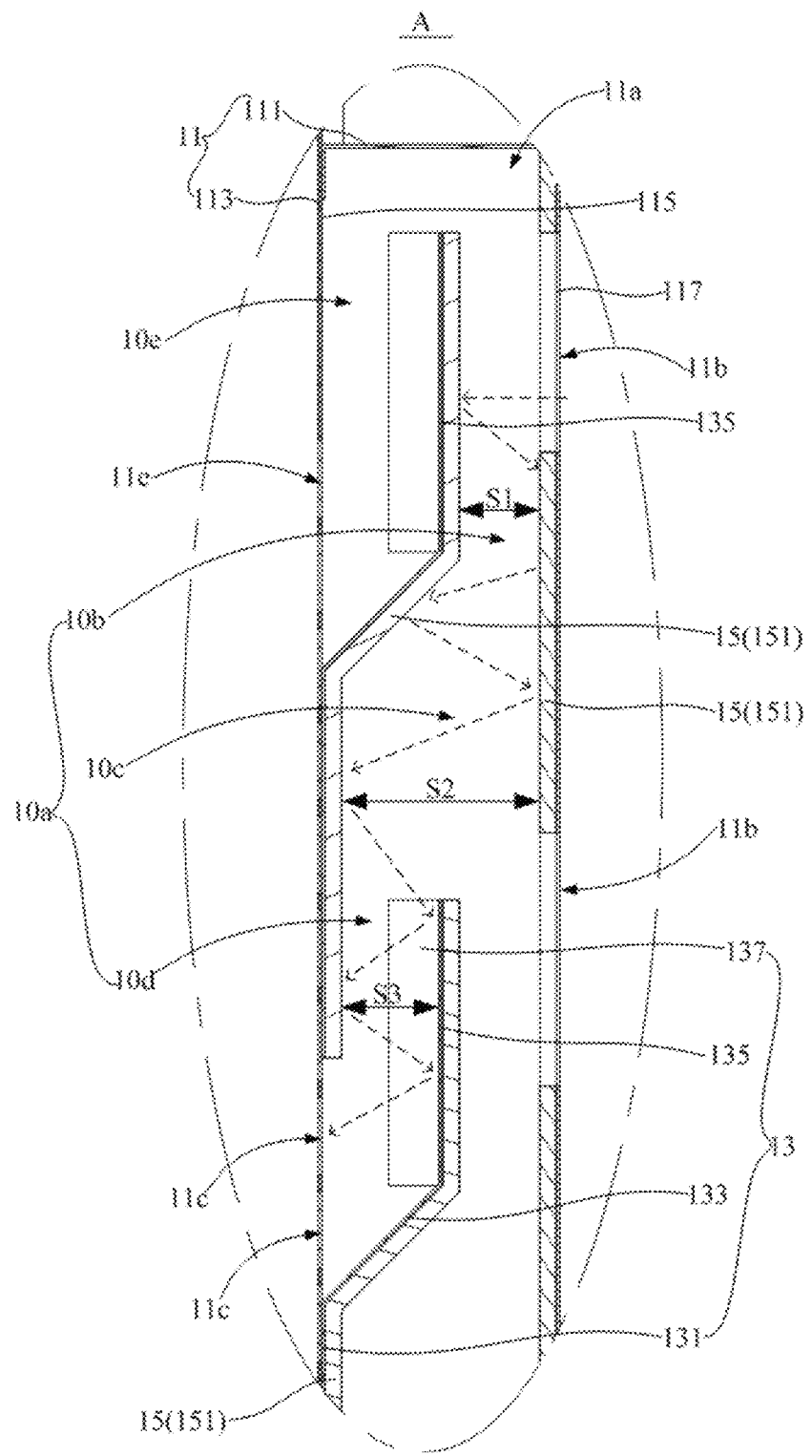
FIG. 6 is a partial enlarged schematic diagram of part A in FIG. 5.
Figure 7:
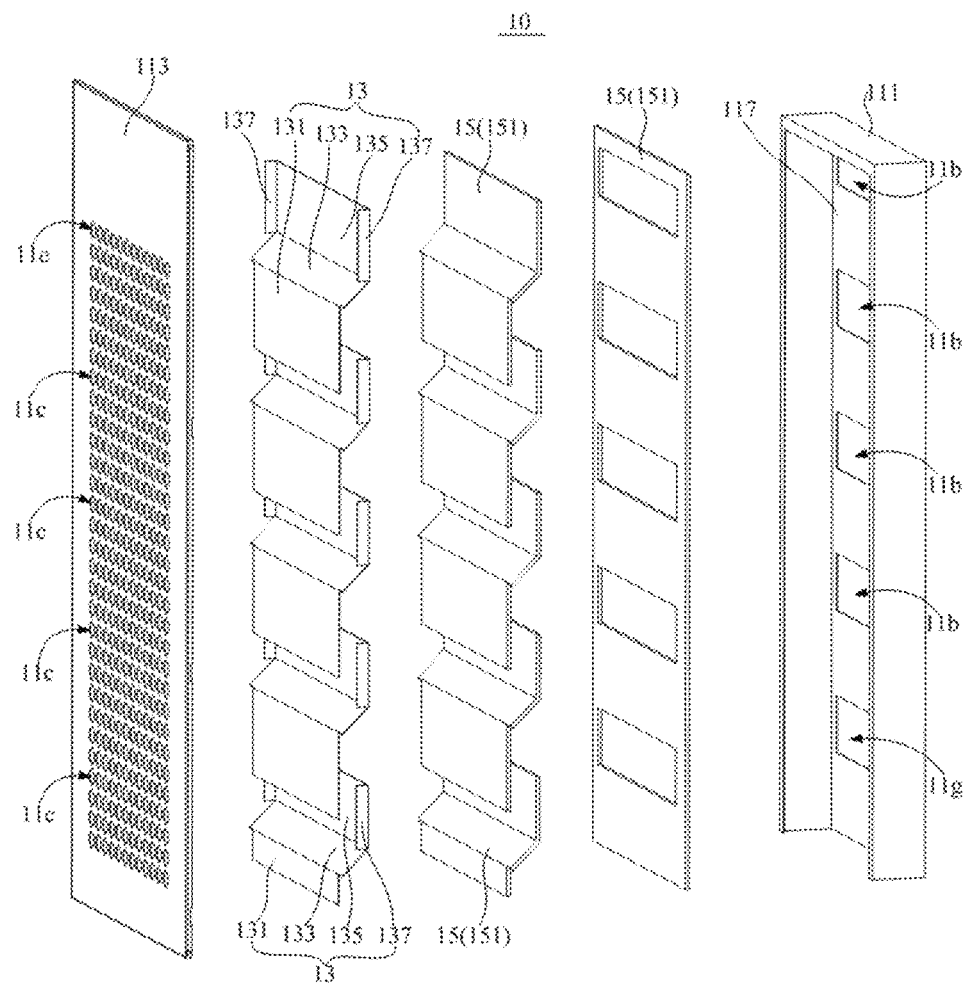
FIG. 7 is a perspective view of the explosion structure of the noise reduction assembly in FIG. 4.
Figure 8:
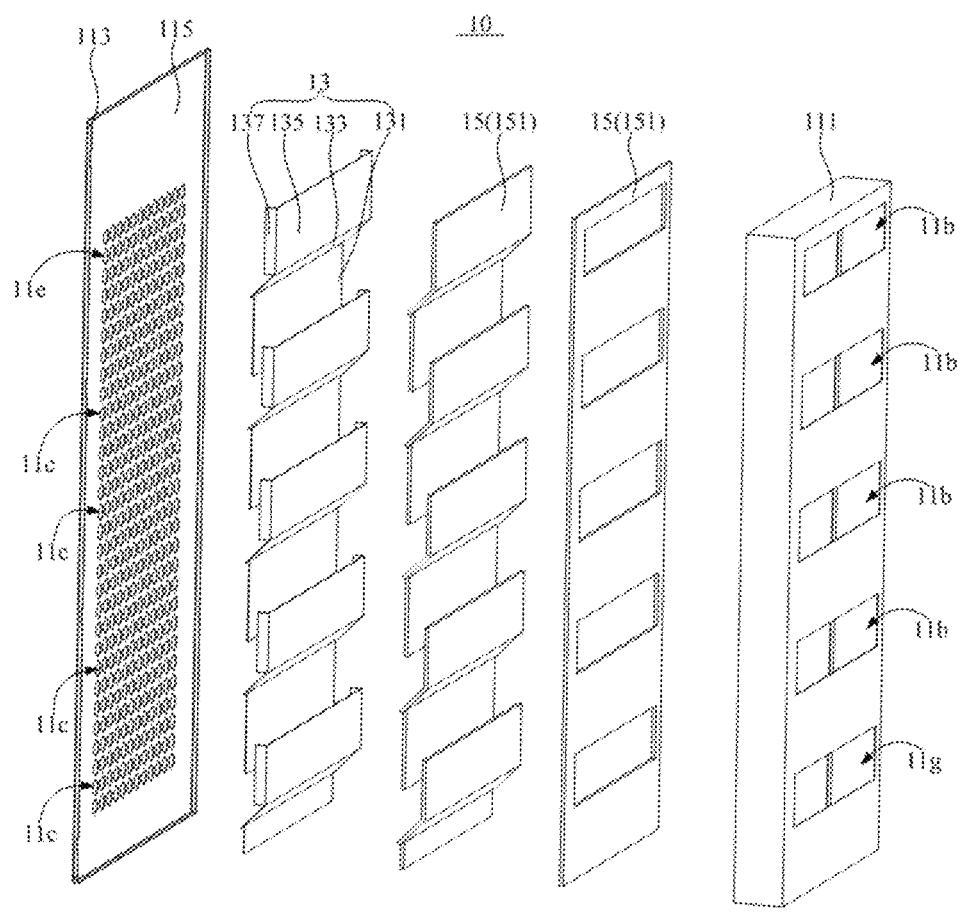
FIG. 8 is another perspective schematic diagram of the explosion structure of the noise reduction assembly in FIG. 4.

Referring to FIG. 4, FIG. 5 and FIG. 6, in an embodiment of the present application, the noise reduction assembly 10 includes an outer frame 11 and a partition plate 13, and the outer frame 11 is provided with an accommodating cavity 11a; the partition plate 13 is arranged in the accommodating cavity 11a, and the partition plate 13 and the outer frame 11 form a noise reduction channel 10a, the noise reduction channel 10a includes a first noise reduction section 10b, a second noise reduction section 10c and a third noise reduction section 10d that are communicated in sequence, the channel cross-sectional areas of the first noise reduction section 10b and the third noise reduction section 10d are both smaller than the channel cross-sectional area of the second noise reduction section 10c.

In an embodiment of the present application, the first noise reduction section 10b of the noise reduction channel 10a can be used to communicate with the heat dissipation device 30 of the new energy equipment 100, and of course, it can also be said to communicate with the accommodation space for accommodating the heat dissipation device 30. The third noise reduction section 10d can be used for communicating with the outside world, and the second noise reduction section 10c can change the channel cross-sectional area of the noise reduction channel 10a. When the noise generated during the operation of the heat dissipation device 30 is transmitted to the outside through the noise reduction channel 10a and the noise passes through each channel section of different channel cross-sections, the impedance of the sound wave of the noise does not match and is reflected, and the noise is attenuated to achieve the noise reduction effect. (Please refer to FIG. 5 and FIG. 6 for the specific noise propagation path. The dashed lines with arrows in FIG. 5 and FIG. 6 represent the transmission and reflection of noise in the noise reduction channel 10a). The first noise reduction section 10b and the second noise reduction section 10c may be directly connected, and of course, a transition section may further be provided between the first noise reduction section and the second noise reduction section. Similarly, the second noise reduction section 10c and the third noise reduction section 10d may be directly connected, and of course, a transition section may further be provided between the second noise reduction section and the third noise reduction section. The channel sections of the first noise reduction section 10b, the second noise reduction section 10c and the third noise reduction section 10d can be square or round, etc., so that the shape of the noise reduction channel 10a is relatively regular, which is conducive to improving the convenience of processing and molding. Of course, the present application is not limited to this. In other embodiments, the channel sections of the first noise reduction section 10b, the second noise reduction section 10c and the third noise reduction section 10d may also be triangular or other shapes. In addition, the heat dissipation device 30 can be a heat dissipation fan. The heat dissipation fan provides driving force, so that the external cooling air can be better driven to enter the noise reduction channel 10a through the third noise reduction section 10d, and then flow out through the first noise reduction section 10b to enter the new energy equipment 100. The cooling air exchanges heat with the electrical components of the new energy equipment 100 to further improve the heat dissipation effect of the new energy equipment 100. Of course, the present application is not limited to this, and in other embodiments, the heat dissipation device 30 may also be a device that can be used for heat dissipation, such as a refrigeration semiconductor or a refrigeration compressor.

When the noise reduction assembly 10 of the technical solution of the present application is applied to the new energy equipment 100, the noise reduction channel 10a can be used for communicating with the heat dissipation device 30 of the new energy equipment 100. Moreover, the noise reduction channel 10a of the noise reduction assembly 10 in this solution includes a first noise reduction section 10b, a second noise reduction section 10c and a third noise reduction section 10d that are communicated in sequence. The channel cross-sectional areas of the first noise reduction section 10b and the third noise reduction section 10d are both smaller than the channel cross-sectional area of the second noise reduction section 10c. In the process that the noise generated when the heat dissipation device 30 works is transmitted to the outside through the noise reduction channel 10a, due to the sudden change of the cross-sectional area of the noise reduction channel 10a at the connection between various sections, the impedance of the noise sound waves may be mismatched and reflected, and the intensity of noise may be attenuated. Therefore, the sound energy of the noise generated by the heat dissipation device 30 when it works to the outside is greatly reduced, thus reducing the noise of the new energy equipment 100 when it works. In addition, according to the noise reduction channel 10a of the noise reduction assembly 10 in this solution, the channel cross-sectional area of the noise reduction channel 10a is changed by setting a second noise reduction section 10c with a relatively large channel cross-sectional area. As a result, the overall channel cross-sectional area of the noise reduction channel 10a is still relatively large, which can ensure a large air intake volume, thereby ensuring the heat dissipation effect on the electrical components in the new energy equipment 100. That is, the noise reduction assembly 10 in this solution not only has a noise reduction effect on the new energy equipment 100, but also can ensure the heat dissipation effect on the new energy equipment 100. In addition, the noise reduction assembly 10 in this solution includes an outer frame 11 and a partition plate 13, so that the outer frame and the partition plate can be manufactured independently, and then assembled into a whole to form a noise reduction channel 10a. The structures of the outer frame 11 and the partition plate 13 are relatively simple, which is conducive to improving the convenience of processing and forming the noise reduction channel 10a.

Referring to FIG. 4 to FIG. 8, in an embodiment of the present application, multiple partition plates 13 are provided, the multiple partition plates 13 are all arranged in the accommodating cavity 11a, and are sequentially arranged in a direction that one side of two opposite sides of the outer frame 11 faces the other side; a part of the structure of each partition plate 13 and the outer frame 11 form a first noise reduction section 10b and a second noise reduction section 10c, the other part of the structure, the adjacent part of the structure of the partition plate 13 and the outer frame 11 form a third noise reduction section 10d; the outer frame is further provided with a channel inlet 11b communicated with the first noise reduction section, and a channel outlet 11c communicated with the third noise reduction section 10d.

In this embodiment, the noise reduction assembly 10 can form multiple noise reduction channels 10a by the outer frame 11 and multiple partition plates 13, so that the noise reduction assembly 10 can be arranged corresponding to multiple heat dissipation devices 30. The new energy equipment 100 is usually provided with multiple heat dissipation devices 30. Therefore, the noise reduction assembly 10 at this time can be well adapted for use, that is, one noise reduction assembly 10 can simultaneously conduct air intake and noise reduction for multiple heat dissipation devices 30, thus improving the convenience of assembling the new energy equipment 100. Of course, it should be noted that this application is not limited to this, and in other embodiments, the number of the partition plates 13 may be one, and at this time, the partition plates 13 and the outer frame 11 form a noise reduction channel 10a.

In order to improve the convenience of mounting the partition plate 13 in the outer frame 11, the outer frame 11 may further include a bottom frame 111 and a panel 113, the bottom frame 111 may be of a box structure with an opening, and the panel 113 covers the opening of the bottom frame 111. During assembly, multiple partition plates 13 may be conveniently mounted in the bottom frame 111 through the openings of the bottom frame 111, and then the panel 113 is covered to complete the assembly of the noise reduction assembly 10. Furthermore, in order to facilitate cleaning or maintenance and replacement of the partition plate 13 in the outer frame 11, the panel 113 may be detachably connected to the bottom frame 111. Specifically, the panel 113 may be fixed on the bottom frame 111 by screws or buckles, so as to ensure the stability of the connection between the panel 113 and the bottom frame 111, simplify the assembly process of the panel and the bottom frame and improve the assembly efficiency of the noise reduction assembly 10. In addition, the channel outlet 11c may be set relatively small, and the number can be set more. That is, a third noise reduction section 10d corresponds to multiple channel outlets 11c, so as to reduce the area of a single channel outlet 11c, reduce the possibility of foreign granular garbage entering the noise reduction channel 10a from the channel outlet 11c, and at the same time ensure the overall air intake effect of the channel outlet 11c and the channel 10a. The channel inlet 11b can be set relatively large, and one first noise reduction section 10b corresponds to one channel inlet 11b, so as to improve the convenience of opening the channel inlet 11b on the outer frame 11.

Referring to FIG. 4 to FIG. 9, in an embodiment of the present application, in a direction parallel to the arrangement of the multiple partition plates 13, each of the partition plates 13 includes a first plate body 131, a second plate body 133 and a third plate body 135 connected in sequence; it is defined that the accommodating cavity 11a has a first inner wall 115 and a second inner wall 117 which are opposite to each other in the direction perpendicular to the arrangement direction of the partition plates. The first plate body 131 is attached to the first inner wall 115. The second plate body 133 extends toward the second inner wall 117. The third plate body 135 extends along the direction, away from the first plate body 131, of the second plate body 133, and a gap is present between the third plate body 135 and the second inner wall 117. One of the two adjacent partition plates 13 is defined as the first partition plate, and the other of the two adjacent partition plates is defined as the second partition plate. The end of the first plate body 131 of the first partition plate away from the second plate body 133, the third plate body 135 of the second partition plate and the cavity wall of the accommodating cavity 11a connecting the first inner wall 115 and the second inner wall 117 form the third noise reduction section 10d. The end of the first plate body 131 of the first partition plate close to the second plate body 133, the second inner wall 117 and the cavity wall connecting the first inner wall 115 and the second inner wall 117 of the accommodating cavity 11a form the second noise reduction section 10c. The third plate body 135 of the first partition plate, the second inner wall 117 and the cavity wall of the accommodating cavity 11a connecting the first inner wall 115 and the second inner wall 117 form the first noise reduction section 10b.

In this embodiment, the first plate body 131, the second plate body 133 and the third plate body 135 are arranged in sequence parallel to the arrangement direction of the multiple partition plates 13, so that the first noise reduction section 10*b*, the second noise reduction section 10*c* and the third noise reduction section 10*d* are also distributed in the sequential distribution direction of the multiple partition plates 13. The noise reduction channel 10*a* makes good use of the space in the sequential arrangement direction of the multiple partition plates 13, the distance between the first inner wall 115 and the second inner wall 117 can be set relatively small without occupying a large space, so as to improve the convenience of installation in the new energy device 100. Moreover, the partition plate 13 thus set is connected to the two adjacent noise reduction channels 10*a* formed by the outer frame 11, that is, the first noise reduction section 10*b* of one noise reduction channel 10*a* is connected to the second noise reduction section 10*c* of the adjacent noise reduction channel 10*a*. The noise generated by the heat dissipation device 30 during operation may enter the adjacent two noise reduction channels 10*a* for certain attenuation, which is beneficial to further improving the noise reduction effect of the new energy equipment 100. Meanwhile, the communicating arrangement of the noise reduction channels may further improve the fluidity of the airflow in the noise reduction assembly 10, thereby further improving the heat dissipation effect on the new energy equipment 100. In addition, this arrangement may also make the shape of each partition plate 13 more regular, which is conducive to improving the convenience of processing and molding the partition plate 13. In case that the outer frame 11 includes the bottom frame 111 and the panel 113, the wall surface of the panel 113 facing the bottom frame 111 may be formed as the first inner wall 115. A wall surface of the bottom frame 111 facing the panel 113 may be formed as a second inner wall 117.

In an embodiment of the present application, the first plate body 131, the second plate body 133 and the third plate body 135 are all arranged in a flat plate shape.

Figure 10:
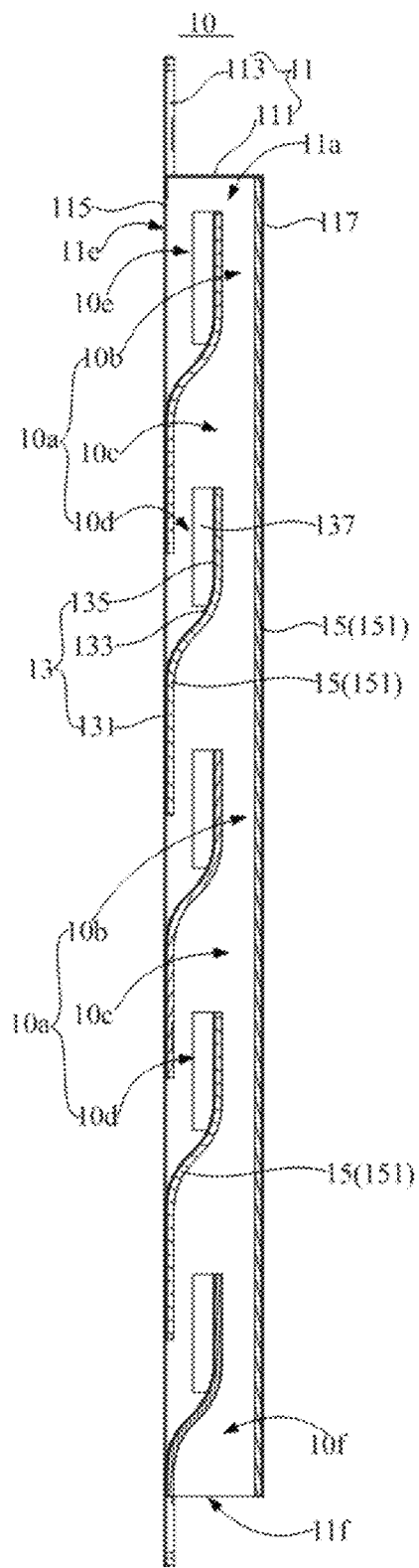
FIG. 10 is a schematic cross-sectional view of another embodiment of the noise reduction assembly of the present application.
Figure 11:
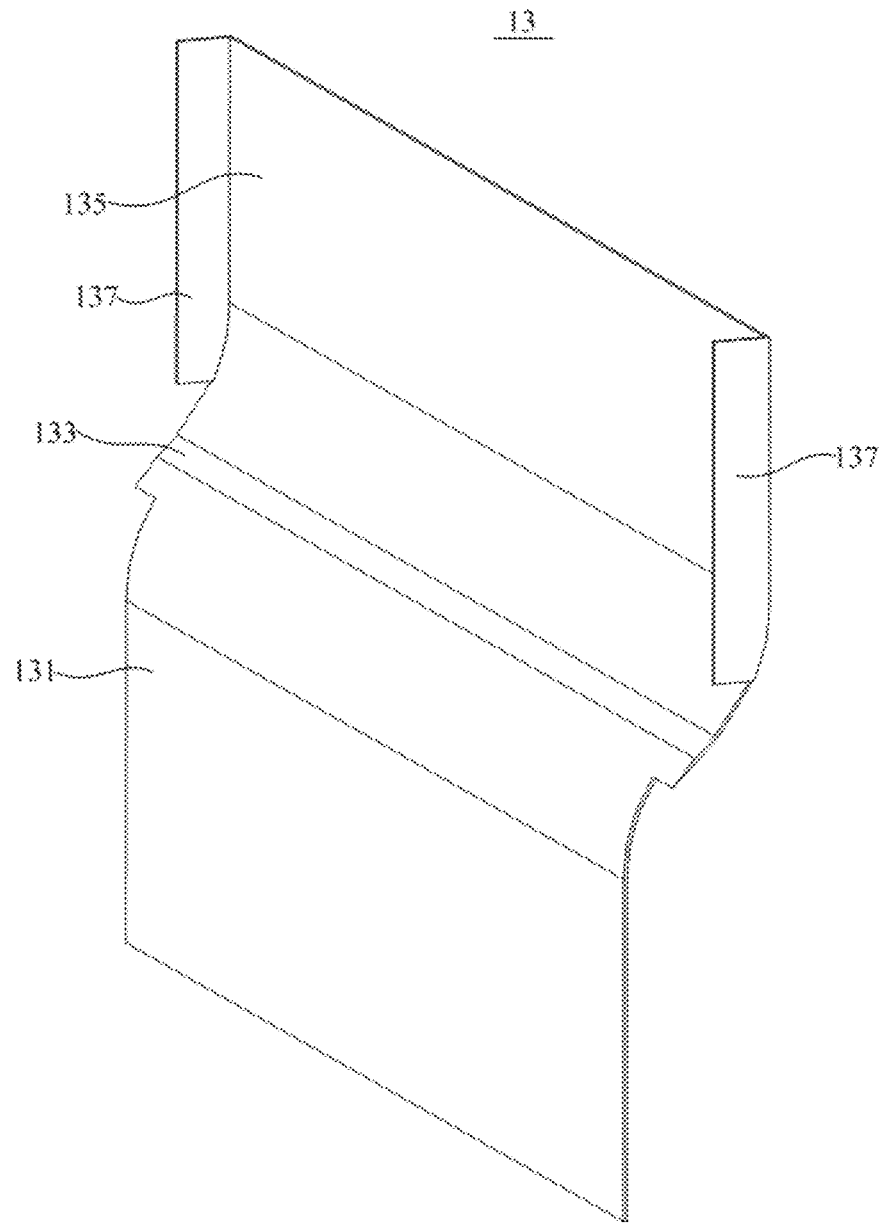
FIG. 11 is the schematic structural diagram of the partition plate in FIG. 10.

In this embodiment, the first plate body 131, the second plate body 133 and the third plate body 135 are all arranged in a flat plate shape. The structure is simpler, which is beneficial to improving the convenience of processing and molding the partition plate 13. With this arrangement, the first plate body 131 and the first inner wall 115 of the accommodating cavity 11*a* may be tightly attached, which is beneficial to improving the compactness of the installation of the first plate body and the accommodating cavity. Of course, it should be noted that the present application is not limited to this, In other embodiments, referring to FIG. 10 and FIG. 11, the first plate body 131 and the third plate body 135 of the partition plate 13 may also be arranged in a flat plate shape, and the second plate body 133 may be arranged in an arc-shaped plate shape. The joints of the second plate body 133, the first plate body 131 and the third plate body 135 may all be arranged in a circular arc transition, which is conducive to guiding noise or air flow, so as to further improve the noise reduction effect and heat dissipation effect of the noise reduction assembly 10. In short, the partition plate 13 in the present application can be roughly Z-shaped, S-shaped or other shapes.

Figure 9:
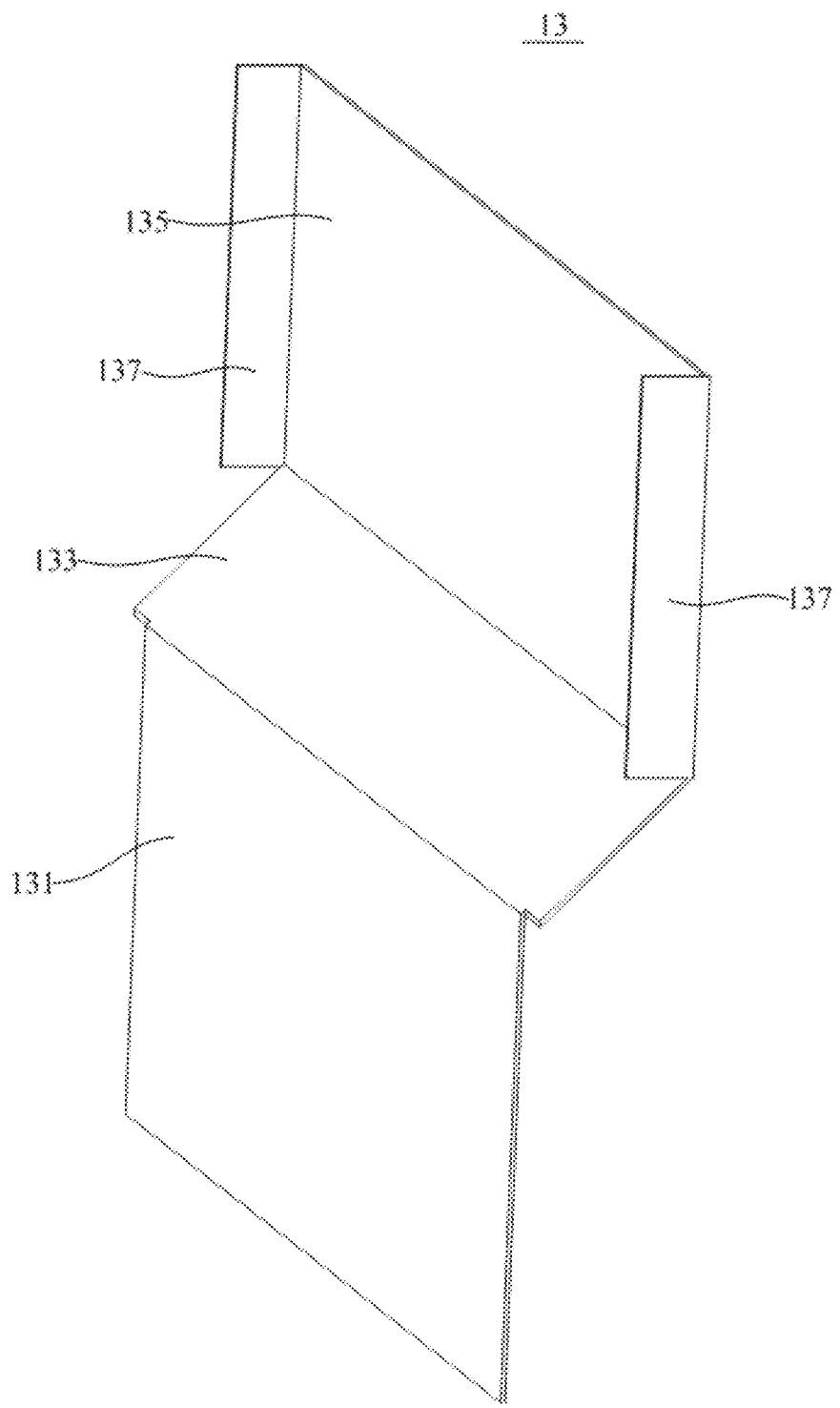
FIG. 9 is the schematic structural diagram of the partition plate of the noise reduction assembly in FIG. 7.

Referring to FIG. 5 and FIG. 9, in an embodiment of the present application, the included angles formed by the second plate body 133, the first plate body 131 and the third plate body 135 are all obtuse. When the first plate body 131, the second plate body 133 and the third plate body 135 are all flat, the included angle formed by the planes of each plate body is the included angle formed by the joint of the second plate body 133 and the first plate body 131; when the first plate body 131, the second plate body 133 and the third plate body 135 are all arc-shaped plates, the angle formed by the tangent line at the joint of each plate body is the angle formed by the joint of the second plate body 133 and the first plate body 131).

In this embodiment, the included angles formed at the joints of the second plate body 133, the first plate body 131 and the third plate body 135 are all obtuse, so that the noise generated by the heat dissipation device 30 in the new energy equipment 100 during operation may smoothly enter the second noise reduction section 10*c* when the noise is in the first noise reduction section 10*b*, the noise in the second noise reduction section 10*c* may smoothly enter the third noise reduction section 10*d*, so that the noise can be sufficiently reduced in each noise reduction section to further improve the noise reduction effect. The included angle formed by the second plate body 133 and the first plate body 131 is obtuse, so that the airflow in the second noise reduction section 10*c* may be guided by the second plate body 133 into the first noise reduction section 10*b* when flowing into the new energy equipment 100. This arrangement may improve the smoothness of the air flow there, so as to further ensure the air outlet effect of the noise reduction channel 10*a*. The second plate body 133 and the third plate body 135 are arranged at an obtuse angle, so that the external air flow can be guided by the second plate body 133 and enter the third noise reduction section 10*d* after passing through the channel outlet 11*c*. The smoothness of the outside air entering the third noise reduction section 10*d* is improved, thereby helping to ensure the air intake effect. In this way, the included angles formed by the second plate body 133, the first plate body 131 and the third plate body 135 are all obtuse. It can be ensured that the air flow from the outside can pass through the noise reduction channel 10*a* better, which is further beneficial to ensuring the heat dissipation effect on the new energy equipment 100. Meanwhile, this arrangement may also reduce the possibility of large collision between the external cooling air and the inner wall surface of the noise reduction channel 10*a*, thereby helping to avoid a large impact between them and causing noise. In addition, it should be noted that the present application is not limited to this, in other embodiments, the included angles formed by the second plate body 133, the first plate body 131 and the third plate body 135 are all arranged at right angles.

In an embodiment of the present application, the first plate body 131, the second plate body 133 and the third plate body 135 are of an integrated structure.

In this embodiment, the first plate body 131, the second plate body 133 and the third plate body 135 are integrally arranged, which may enhance the strength of their joint, thus being beneficial to improving the overall strength of the partition plate 13 and ensuring the service life. This arrangement also enables the first plate body 131, the second plate body 133 and the third plate body 135 to be manufactured by integral molding, which can simplify the processing technology and help improve the processing efficiency of the partition plate. During installation, the integrally arranged partition plate 13 can also be mounted on the outer frame 11 at one time, which is beneficial to improve the convenience of installation of the partition plate 13.

Referring to FIG. 5 and FIG. 9, in an embodiment of the present application, the partition plate 13 further includes a fourth plate body 137, the fourth plate body 137 is connected to one side, adjacent to the second plate body 133, of the third plate body 135, and an included angle is formed by the fourth plate body 137 and the third plate body 135. The fourth plate 137 abuts against and is connected to cavity walls, connecting the first inner wall 115 and the second inner wall 117, of the accommodating cavity 11a.

In this embodiment, the fourth plate body 137 may stably abut against the outer frame 11 and is given an installation position. Therefore, through the fourth plate body 137, the partition plate 13 may be better mounted on the outer frame 11, and the fixing effect of the partition plate 13 can be ensured. The fourth plate body 137, the first plate body 131, the second plate body 133 and the third plate body 135 can be integrally formed. In addition, in order to facilitate maintenance and replacement of the partition plate 13, the fourth plate body 137 may be detachably connected to the bottom frame 111 of the outer frame 11. Specifically, the fourth plate body 137 can be fixed on the bottom frame 111 by screws or buckles, so as to simplify the installation process of the partition plate 13 and improve the installation efficiency of the partition plate 13 while ensuring the connection stability of the partition plate 13.

Referring to FIG. 5 to FIG. 8, in an embodiment of the present application, multiple channel inlets 11b are all arranged on the second inner wall 117, and multiple channel outlets 11c are all arranged on the first inner wall 115.

In this embodiment, multiple channel inlets 11b are all arranged on the second inner wall 117, and multiple channel outlets 11c are all arranged on the first inner wall 115, so that the channel inlet 11b and the channel outlet 11c are respectively located on the two opposite walls of the outer frame 11. It can improve the smoothness of the noise generated by the heat dissipation device 30 flowing in the noise reduction channel 10a during operation, and is beneficial to ensuring the noise attenuation effect of the first noise reduction section 10b, the second noise reduction section 10c and the third noise reduction section 10d. This arrangement also enables the external cooling air to be better guided by the second plate body 133 after passing through the channel outlet 11c, and flow out smoothly from the channel inlet 11b, thus being beneficial to improving the ventilation effect of the noise reduction channel 10a. Of course, it should be noted that the present application is not limited to this, in other embodiments, the channel inlet 11b and the channel outlet 11c may also be provided on the cavity wall of the accommodating cavity 11a connecting the first inner wall 115 and the second inner wall 117.

Referring to FIG. 5 and FIG. 6, in an embodiment of the present application, each of the channel inlets 11b is arranged opposite to one of the third plate bodies 135.

In this embodiment, a channel inlet 11b is arranged just opposite to a third plate body 135, so that the noise generated by the heat dissipation device 30 arranged corresponding to the channel inlet 11b during operation enters the noise reduction channel 10a, the noise can be sufficiently blocked by the third plate body 135 and then enter the first noise reduction section 10b, and fully reflected in the first noise reduction section 10b, so as to better attenuate the noise. Of course, it should be noted that the present application is not limited to this, in other embodiments, it is also possible for each channel inlet 11b to be partially corresponding to one third plate body 135 or completely misaligned.

Referring to FIG. 5 and FIG. 6, in an embodiment of the present application, the uppermost partition plate 13 among the multiple partition plates 13 and the outer frame 11 at a side away from the channel inlet 11b form a first auxiliary air duct 10e, and a gap is present between the uppermost partition plate 13 and an upper cavity wall of the accommodating cavity 11a. The outer frame 11 is further provided with a first auxiliary air inlet 11e that communicates with the first auxiliary air duct 10e.

In this embodiment, the first auxiliary air duct 10e is formed, so that not only can the noise of the electrical devices in the new energy equipment 100 be reduced by air intake through the noise reduction channel 10a, but also air can be fed through the first auxiliary air duct 10e. After passing through the gap between the partition plate 13 and the upper cavity wall of the accommodating cavity 11a, the air can flow out from the uppermost channel inlet 11b, thus further increasing the intake air volume and improving the heat dissipation effect of the new energy equipment 100.

Referring to FIG. 5 and FIG. 6, in an embodiment of the present application, the partition plate 13 located at the lowest among the multiple partition plates 13 and the outer frame 11 on a side facing the channel inlet 11b form a second auxiliary air duct 10f. The second auxiliary air duct 10f is connected to the second noise reduction section 10c of the lowest noise reduction channel 10a. The outer frame 11 is further provided with a second auxiliary air inlet 11f and an auxiliary air outlet 11g that communicate with the second auxiliary air duct 10f. The auxiliary air outlet 11g is arranged adjacent to the lowest channel inlet 11b.

In this embodiment, the second auxiliary air duct 10f is provided, so that air can be further fed through the second auxiliary air duct 10f, thereby further increasing the air intake volume and improving the heat dissipation effect of the new energy equipment 100. Meanwhile, when the noise generated by the operation of the heat dissipation device 30 enters the second auxiliary air duct 10f through the auxiliary air outlet 11g, it may also enter the lowest noise reduction channel 10a for certain attenuation and noise reduction, thus improving the noise reduction effect of the new energy equipment 100.

Referring to FIG. 5 and FIG. 6, in an embodiment of the present application, it is defined that a channel cross-sectional area of the first noise reduction section 10b is S1, a channel cross-sectional area of the second noise reduction section 10c is S2, and a channel cross-sectional area of the third noise reduction section 10d is S3, satisfying the relationship: $S1/S2 \leq \frac{1}{2}$, and/or $S3/S2 \leq \frac{1}{2}$.

In this embodiment, the channel cross-sectional area S1 of the first noise reduction section 10b and the channel cross-sectional area S2 of the second noise reduction section 10c satisfy $S1/S3 \leq \frac{1}{2}$, and/or, when the channel cross-sectional area of the third noise reduction section 10d is S3 and the channel cross-sectional area S2 of the second noise reduction section 10c satisfies $S2/S3 \leq \frac{1}{2}$, the channel cross-sectional area of the second noise reduction section 10c of the noise reduction channel 10a can be made relatively large, so as to increase the abrupt effect of the channel cross-sectional area of the noise reduction channel 10a. The impedance of the sound waves of the noise can be further mismatched and reflected, thereby enhancing the attenuation intensity of the noise and further improving the noise reduction effect on the new energy equipment 100. With this arrangement, the first noise reduction section 10b and the third noise reduction section 10d also have a certain channel cross-sectional area, and it is beneficial to ensuring the air intake effect of the noise reduction channel 10a, so that the external air flow can enter the new energy equipment 100 to ensure the heat dissipation effect of the new energy equipment 100. Moreover, this arrangement also makes the overall volume of the noise reduction channel 10a not too large, so that the noise reduction assembly 10 can be better mounted in the limited space on the new energy equipment 100. Of course, it should be noted that the present application is not limited to this, in other embodiments, other proportional relationships may exist between the channel cross-sectional area S1 of the first noise reduction stage 10b and the channel cross-sectional area S2 of the second noise reduction stage 10c, and between the channel cross-sectional area S3 of the third noise reduction stage 10d and the channel cross-sectional area S2 of the second noise reduction stage 10c. As long as it is ensured that the cross-sectional area S1 of the first noise reduction section 10b and the cross-sectional area S3 of the third noise reduction section 10d are both smaller than the cross-sectional area S2 of the second noise reduction section 10c.

In an embodiment of the present application, the channel cross-sectional area S1 of the first noise reduction section 10b is equal to the channel cross-sectional area S3 of the third noise reduction section 10d.

In this embodiment, the channel cross-sectional area of the first noise reduction section 10b is set to be equal to the channel cross-sectional area of the third noise reduction section 10d, it can be ensured that the outside air flow has the same throughput in the first noise reduction section 10b and the third noise reduction section 10d. The external cooling air may flow relatively smoothly in the noise reduction channel 10a, which is beneficial to further ensuring the heat dissipation effect on the new energy equipment 100. This arrangement also makes the shape of the noise reduction channel 10a relatively regular, which is beneficial to improving the convenience of forming the noise reduction channel 10a. Of course, it should be noted that the present application is not limited to this, in other embodiments, the channel cross-sectional area S1 of the first noise reduction section 10b may also be different from the channel cross-sectional area S3 of the third noise reduction section 10d.

Referring to FIG. 5 to FIG. 8, in an embodiment of the present application, a silencing layer 15 is provided on the inner wall surface of the noise reduction channel 10a.

In this embodiment, the noise transmitted into the noise reduction channel 10a can be further absorbed by the silencing layer 15, thereby further improving the noise reduction effect on the new energy equipment 100. The silencing layer 15 can be attached to the inner walls of the first noise reduction section 10b, the second noise reduction section 10c and the third noise reduction section 10d, so as to fully absorb the noise transmitted into the noise reduction channel 10a. Of course, the silencing layer 15 may be attached only to the inner wall of the first noise reduction section 10b, the inner wall of the second noise reduction section 10c, or the inner wall of the third noise reduction section 10d.

In an embodiment of the present application, the silencing layer 15 is adhered and secured to the inner wall surface of the noise reduction channel 10a.

In this embodiment, the silencing layer 15 is secured by bonding, so that there is no need to provide a complicated connection structure on the inner wall surface of the noise reduction channel 10a, which is conducive to simplifying the structure of the noise reduction assembly 10. This arrangement may also increase the connection area between the silencing layer 15 and the inner wall surface of the air inlet channel, thereby helping to improve the stability of the installation of the silencing layer 15. Of course, the present application is not limited to this, in other embodiments, it is also possible that a clamping block is provided on the inner wall surface of the air inlet channel to clamp and fix the silencing layer 15; or the silencing layer is directly fixed by screws. In addition, in an embodiment of the present application, the silencing layer 15 may be silencing cotton 151.

It can be understood that the silencing cotton 151 has the advantages of good silencing effect, relatively long service life and relatively low cost, which is conducive to improving the silencing effect of the silencing layer 15 and reducing the manufacturing cost. Of course, it should be noted that the present application is not limited to this, in other embodiments, the silencing layer 15 may be a silencing cloth or the like.

Referring to FIG. 1 to FIG. 3, a new energy equipment 100 is further provided according to the present application, which includes a heat dissipation device 30 and the noise reduction assembly 10. The specific structure of the noise reduction assembly 10 refers to the above-mentioned embodiments, and since the new energy equipment 100 adopts all the technical solutions of all the above-mentioned embodiments, it has at least all the beneficial effects brought by the technical solutions of the above-mentioned embodiments, which are repeated herein. The third noise reduction section 10d of the noise reduction assembly 10 is communicated with the heat dissipation fan 30. The new energy equipment 100 may be an energy storage cabinet, and of course may also be an inverter or a charging pile or the like. That is, the specific type of the new energy equipment 100 is not limited in the present application.

In an embodiment of the present application, the heat dissipation device 30 is a heat dissipation fan.

In this embodiment, the heat dissipation device 30 is set as a heat dissipation fan, so that the heat dissipation device 30 can provide driving force to drive the external air flow into the new energy equipment 100 through the noise reduction channel 10a, and exchange heat with the internal electrical devices, thus being beneficial to improving the heat dissipation effect of the new energy equipment 100.

The above is only a preferred embodiment of the present disclosure, which does not limit the patent scope of the present disclosure. Under the inventive concept of the present disclosure, any equivalent structural transformation made by using the contents of the specification and drawings of the present disclosure or direct/indirect application in other related technical fields is included in the patent protection scope of the present disclosure.

The invention claimed is:

1. A noise reduction assembly, comprising:
   an outer frame, wherein an accommodating cavity is arranged in the outer frame; and
   a partition plate, wherein the partition plate is arranged in the accommodating cavity, and the partition plate and the outer frame form a noise reduction channel, the noise reduction channel comprises a first noise reduction section, a second noise reduction section and a third noise reduction section that are communicated in sequence, and channel cross-sectional areas of the first noise reduction section and the third noise reduction section are both smaller than a channel cross-sectional area of the second noise reduction section,
   wherein a plurality of partition plates is provided, the plurality of partition plates are all arranged in the accommodating cavity, and are sequentially arranged in a direction that one side of the opposite sides of the outer frame faces the other side;
   wherein one part of the structure of each partition plate and the outer frame form the first noise reduction section and the second noise reduction section, the other part of the structure, one part of the structure of an adjacent partition plate and the outer frame form the third noise reduction section;

wherein the outer frame is further provided with a channel inlet communicated with the first noise reduction section, and a channel outlet communicated with the third noise reduction section.

2. The noise reduction assembly according to claim 1, wherein in a direction that is parallel to an arrangement direction the plurality of partition plates, each partition plate comprises a first plate body, a second plate body and a third plate body connected in sequence;

it is defined that the accommodating cavity has a first inner wall and a second inner wall which are opposite to each other in a direction that is perpendicular to the arrangement direction of the partition plates, the first plate body is attached to the first inner wall, the second plate body extends toward the second inner wall, the third plate extends along a direction, away from the first plate body, of the second plate body, a gap is further present between the third plate body and the second inner wall.

3. The noise reduction assembly according to claim 2, wherein the first plate body, the second plate body and the third plate body are of a flat plate shape;

or, the first plate body and the third plate body are both of a flat plate shape, and the second plate body is of an arc plate shape.

4. The noise reduction assembly according to claim 2, wherein an included angle formed by the second plate body and the third plate body and an included angle formed by the first plate body and the third plate body are both an obtuse angle;

and/or, the first plate body, the second plate body and the third plate body are of an integral structure;

and/or, the partition plate further comprises a fourth plate body, the fourth plate body is connected to one side, adjacent to the second plate body, of the third plate body, and an included angle is formed by the fourth plate body and the third plate body, the fourth plate abuts against and is connected to cavity walls, connecting the first inner wall and the second inner wall, of the accommodating cavity;

and/or, the outer frame includes a bottom frame and a panel, the panel is covered with the bottom frame, and the panel and the bottom frame form the accommodating cavity.

5. The noise reduction assembly according to claim 2, wherein a plurality of channel inlets are all arranged on the second inner wall, and a plurality of channel outlets are all arranged on the first inner wall.

6. The noise reduction assembly according to claim 5, wherein each of the channel inlets is arranged opposite to one of the third plate bodies;

and/or, an uppermost partition plate among the plurality of partition plates and the outer frame at a side away from the channel outlet form a first auxiliary air duct, and a gap is present between the uppermost partition plate and an upper cavity wall of the accommodating cavity, wherein the outer frame is further provided with a first auxiliary air inlet that communicates with the first auxiliary air duct;

and/or, a lowest partition plate among the plurality of partition plates and the outer frame on a side facing the channel inlet form a second auxiliary air duct, the second auxiliary air duct is connected to the second noise reduction section of a lowest noise reduction channel, the outer frame is further provided with a second auxiliary air inlet and an auxiliary air outlet that communicate with the second auxiliary air duct, wherein the auxiliary air outlet is arranged adjacent to a lowest channel inlet.

7. The noise reduction assembly according to claim 1, wherein it is defined that the channel cross-sectional area of the first noise reduction section is S1, the channel cross-sectional area of the second noise reduction section is S2, and the channel cross-sectional area of the third noise reduction section is S3, satisfying the relationship: $S1/S2 \leq \frac{1}{2}$, and/or $S3/S2 \leq \frac{1}{2}$.

8. The noise reduction assembly according to claim 7, wherein the channel cross-sectional area S1 of the first noise reduction section is equal to the channel cross-sectional area S3 of the third noise reduction section.

9. The noise reduction assembly according to claim 1, wherein an inner wall surface of the noise reduction channel is provided with a silencing layer.

10. The noise reduction assembly according to claim 9, wherein the silencing layer is bonded and secured to the inner wall surface of the noise reduction channel;

and/or, the silencing layer is silencing cotton.

11. A new energy equipment, comprising:
a heat dissipation device; and
the noise reduction assembly according to claim 1, wherein the first noise reduction section of the noise reduction assembly is communicated with the heat dissipation device.

12. The new energy equipment according to claim 11, wherein the heat dissipation device is a heat dissipation fan.

* * * * *